United States Patent
Lee

(10) Patent No.: US 8,013,679 B2
(45) Date of Patent: Sep. 6, 2011

(54) OPERATIONAL AMPLIFIER

(75) Inventor: Won-Hyo Lee, Seodaemun-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/647,514

(22) Filed: Dec. 27, 2009

(65) Prior Publication Data

US 2010/0164589 A1    Jul. 1, 2010

(30) Foreign Application Priority Data

Dec. 31, 2008    (KR) ..................... 10-2008-0137770

(51) Int. Cl.
*H03F 3/45* (2006.01)
*H03F 1/02* (2006.01)
(52) U.S. Cl. ........................... 330/253; 330/9
(58) Field of Classification Search .............. 330/9, 253; 327/307
See application file for complete search history.

(56) References Cited

U.S. PATENT DOCUMENTS 7,078,968 B2 *  7/2006  Gaeta et al. .................. 330/254
7,888,995 B2 *  2/2011  Motoyui .......................... 330/9

* cited by examiner

*Primary Examiner* — Khanh Nguyen
(74) *Attorney, Agent, or Firm* — Sherr & Vaughn, PLLC

(57) ABSTRACT

An operational amplifier capable of suppressing power consumption and noise generation includes an offset modifier including a differential amplification circuit, and an offset memory for storing an offset voltage using a latch circuit. The differential amplification circuit includes first and second NMOS transistors connected to an input terminal, first and second PMOS transistors respectively connected to drains of the first and second NMOS transistors, a third NMOS transistor connected to sources of the first and second NMOS transistors, a third PMOS transistor connected to a source of the second PMOS transistor, a fourth NMOS transistor connected to the third PMOS transistor, to form an output to be applied to the offset memory, and left and right modification blocks each connected to an associated one of the first and second NMOS transistor in parallel.

19 Claims, 4 Drawing Sheets

Sample & Hold Circuit

OPERATIONAL AMPLIFIER

The present application claims priority under 35 U.S.C. §119 to Korean Patent Application No. 10-2008-0137770 (filed on Dec. 31, 2008), which is hereby incorporated by reference in its entirety.

BACKGROUND

Generally, an operational amplifier is a circuit to amplify a difference between input voltages. In the case of an ideal operational amplifier, transistors thereof have the same size and the same threshold voltage. Accordingly, when input voltages are equal, an output voltage from the operational amplifier must be 0V. However, the transistors do not have the same size and the same threshold voltage due to process factors. Meaning, there may be mismatch among the transistors. For this reason, even when the input voltages are equal, a voltage of several μV to several ten mV is output as an output voltage. This voltage is referred to as an "offset voltage." Generally, this offset voltage is removed using a capacitor.

Figure 1:
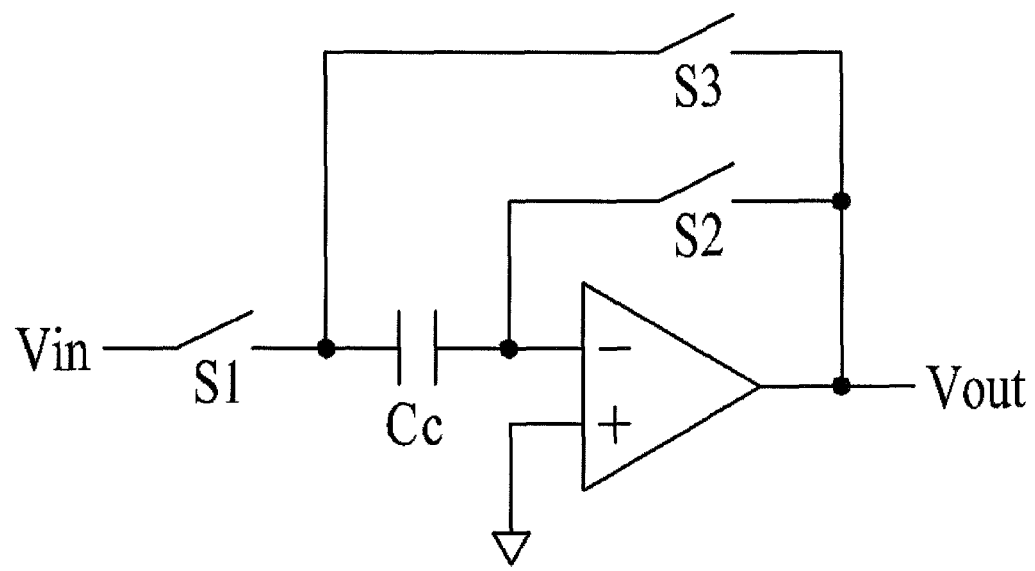

FIG. 1 is a circuit diagram illustrating a sample and hold circuit.

As illustrated in FIG. 1, the sample and hold circuit includes three switches S1, S2, and S3, one operational amplifier, and one capacitor Cc. Operation of the sample and hold circuit will be described as follows. When switches S1 and S3 are closed, input voltage Vin is charged in capacitor Cc. After a certain time, switches S1 and S3 are opened, and switch S2 is closed. In this state, a voltage obtained by adding an offset voltage to the sampled input voltage, is applied to the operational amplifier, as an actual input. As a result, the operational amplifier outputs a voltage obtained by eliminating the offset voltage from an output voltage, which contains the offset voltage.

In the above-mentioned configuration, it is possible to compensate for the offset voltage to some degree. However, it is necessary to use a non-overlap clock and a sampling capacitor. For this reason, it is difficult for this configuration to be used in a structure using a DC level driving buffer or a reference buffer included in an integrated circuit (IC). Noise may be induced in an IC due to continuous switching operation. In this case, operation of other circuits may be degraded. It is also necessary to increase the size of the capacitor used to reduce the influence of switches, etc. Furthermore, there is a difficulty in designing the operational amplifier because the operational amplifier should be maintained in a fixed state during an offset sampling operation thereof.

SUMMARY

Embodiments are related to an operational amplifier that suppresses power consumption and noise generation.

In accordance with embodiments, an operational amplifier can include at least one of the following: an offset modifier including a differential amplification circuit, and an offset memory configured to store an offset voltage using a latch circuit. The differential amplification circuit includes first and second NMOS transistors connected to an input terminal, first and second PMOS transistors respectively connected to drains of the first and second NMOS transistors, a third NMOS transistor connected to sources of the first and second NMOS transistors, a third PMOS transistor connected to a source of the second PMOS transistor, a fourth NMOS transistor connected to the third PMOS transistor, to form an output to be applied to the offset memory, and left and right modification blocks each connected to an associated one of the first and second NMOS transistor in parallel.

DRAWINGS

Figure 2:
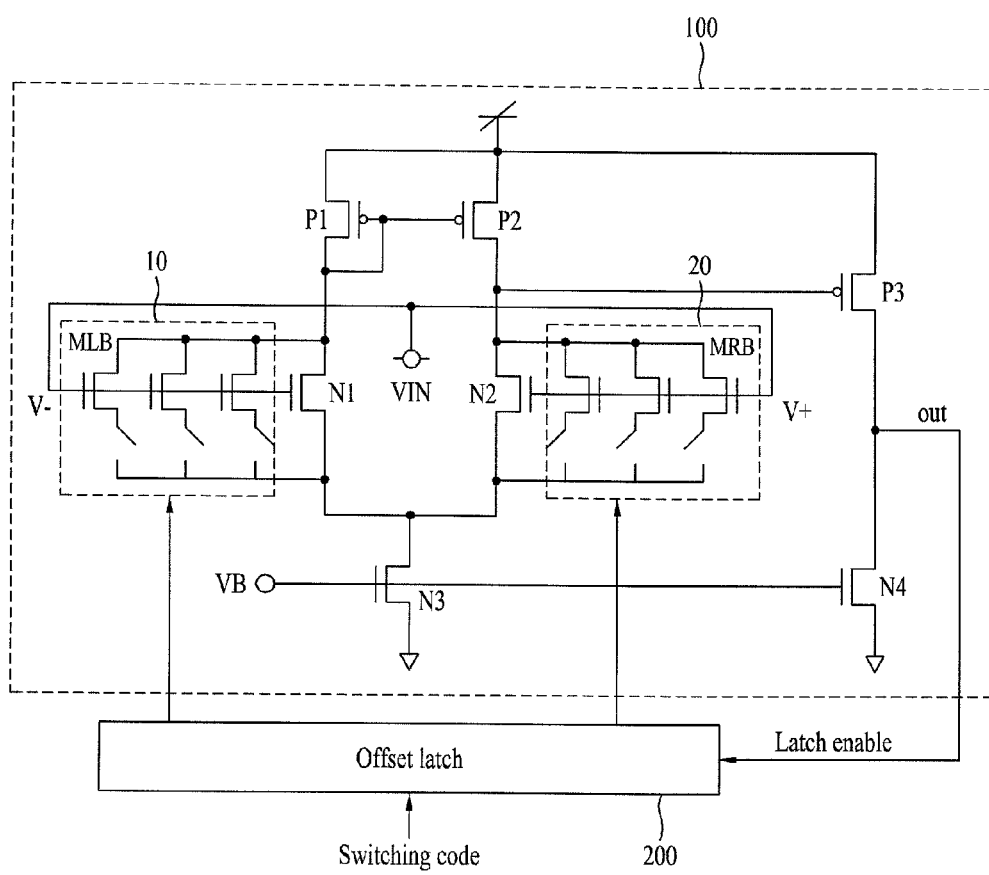
Figure 3:
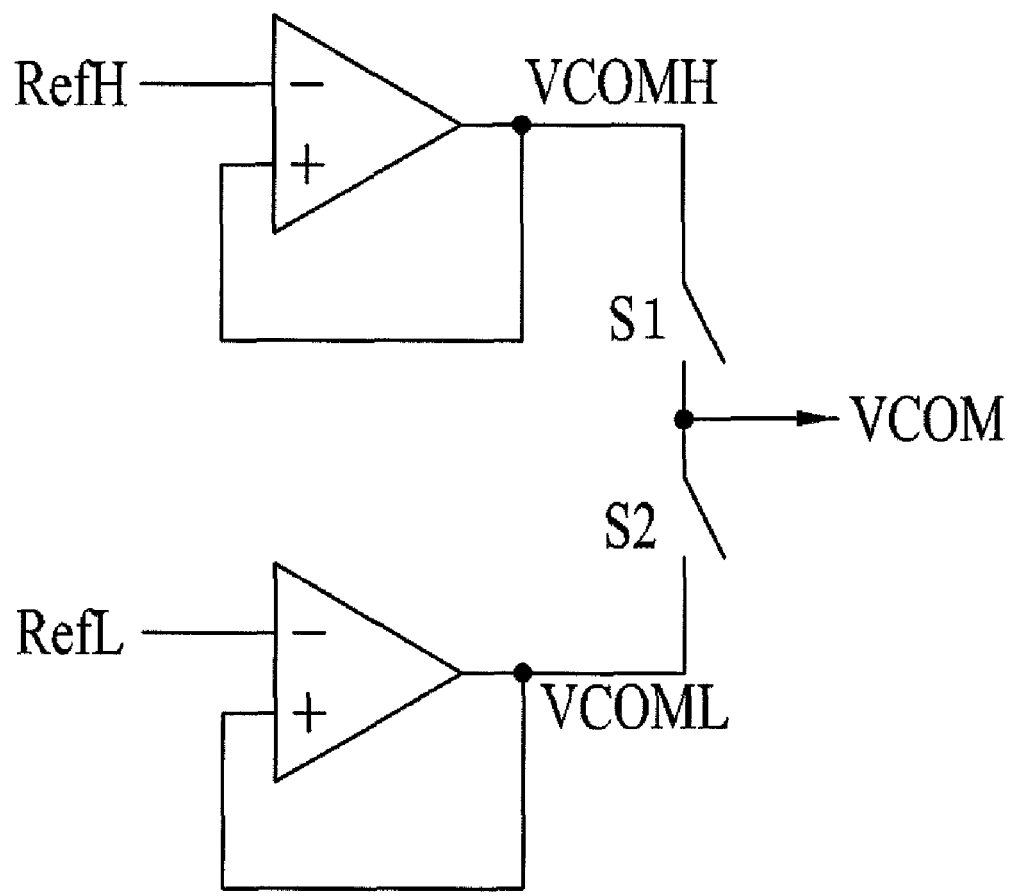
Figure 4:
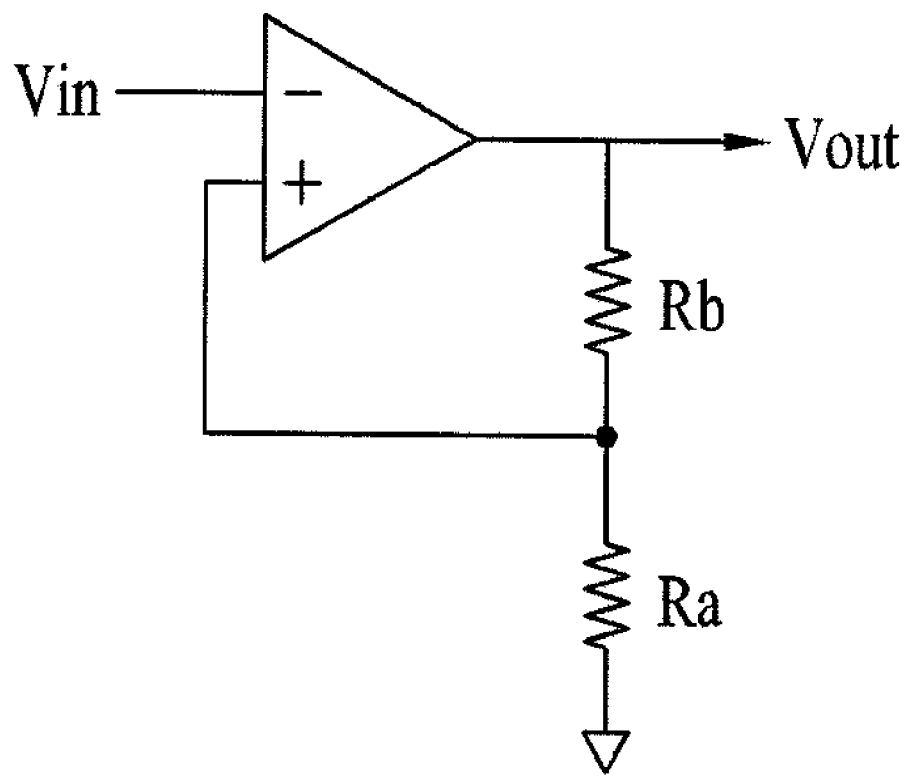

FIG. 1 illustrates a sample and hold circuit;

Example FIGS. 2 to 4 illustrate an operational amplifier, a VCOM driver using the operational amplifier, and a non-inverting amplifier using the operational amplifier, in accordance with embodiments.

DESCRIPTION

Reference will now be made in detail to embodiments, examples of which are illustrated in the accompanying drawings. Although the configurations and functions of embodiments are illustrated in the accompanying drawings and described with reference to the accompanying drawings, the technical idea of embodiments and the important configurations and functions thereof are not limited thereto.

Hereinafter, an operational amplifier in accordance with embodiments will be described in detail with reference to the accompanying drawings.

Example FIG. 2 is a circuit diagram illustrating an operational amplifier in accordance with embodiments.

As illustrated in example FIG. 2, the operational amplifier includes offset modifier 100 which uses a differential amplification circuit, and offset memory 200 which stores an offset voltage measured using a latch circuit. The differential amplification circuit of offset modifier 100 includes a pair of NMOS transistors, namely, first NMOS transistor N1 and second NMOS transistor N2 connected at respective gates thereof to input terminals V− and V+. First PMOS transistor P1 is connected at the source and gate thereof to the drain of first NMOS transistor N1. Second PMOS transistor P2 is connected at the source thereof to the drain of second NMOS transistor N2. First NMOS transistor N1 and second NMOS transistor N2 are connected at the sources thereof to the drain of third NMOS transistor N3. Bias voltage VB is supplied to the gate of third NMOS transistor N3 so that third NMOS transistor N3 functions as a current source.

The source and gate of first PMOS transistor P1 is connected to the drain of first NMOS transistor N1. The source of second PMOS transistor P1 is connected to the drain of second NMOS transistor N2. The gate of second PMOS transistor P2 is connected to the gate of first PMOS transistor P1. First and second PMOS transistors P1 and P2 are connected at the drains thereof, to the drain of third PMOS transistor P3. The gate of third PMOS transistor P3 is connected to a node between second NMOS transistor N2 and second PMOS transistor P2. Fourth NMOS transistor N4 is connected to third PMOS transistor P3 and third NMOS transistor N3. Fourth NMOS transistor N4 forms output OUT of the operational amplifier, which is connected to an input of offset memory 200.

A plurality of NMOS transistors are connected in parallel to each of first NMOS transistor N1 and second NMOS transistor N2 via switches, respectively. The NMOS transistors and switches connected in parallel to first NMOS transistors N1 form left modification block MLB, whereas the NMOS transistors and switches connected in parallel to second NMOS transistors N2 form right modification block MRB. Left and right modification blocks MLB and MRB are connected to offset memory 200. The gate of each transistor in left modification block MLB is connected to the gate of first NMOS transistor N1. The gate of each transistor in right modification block MRB is connected to the gate of second NMOS transistor N2.

Hereinafter, operation of the operational amplifier in accordance with embodiments will be described. When an offset modification step is begun, the operational amplifier operates as a comparator. At this step, the input terminals V+ and V− are short-circuited. Thereafter, the transistor size of right modification block MRB is adjusted or set to a maximal size, whereas the transistor size of left modification block MLB is adjusted or set to a minimal size. In this state, the output of the operational amplifier has an "H" logic level. In this state, the latch circuit forming offset memory 200 operates in a pass mode, so that it transfers all input codes, which are applied thereto, to left and right modification blocks MRB and MLB. The code application is carried out while gradually reducing the transistor size of right modification block MRB. When the transistor size of right modification block MRB reaches the minimal size, a code adjustment is carried out such that the transistor size of left modification block MLB, which has been set to the minimal size, is maximized.

Thereafter, an offset hold step is carried out. When the offset voltage corresponds to "+/−1LSB" during the offset modification step, the output of the operational amplifier is switched. Here, "switching" means that the offset is within a range corresponding to a determined resolution range. At this time, the output voltage is transited from an "H" logic level to an "L" logic level. As the output from the operational amplifier has an "L" logic level, the latch circuit operates in a hold mode. In this state, no further modification code is input.

The above-described operation is carried out once in an initial start-up period. Accordingly, it is possible to achieve an accurate and expectable offset modification without a continuous switching operation.

Hereinafter, an a VCOM driver using the operational amplifier in accordance with embodiments will be described with reference to example FIG. 3.

As illustrated in example FIG. 3, the VCOM driver includes two operational amplifiers connected to each other in parallel, and two switches, namely, first and second switches S1 and S2. Each of the operational amplifiers has the same configuration as the above-described operational amplifier in accordance with embodiments. Respective non-inverting input terminals (+) of the operational amplifiers are connected to input terminals RefH and RefL. The inverting input terminals (−) of the operational amplifiers are connected to the output terminals of the operational amplifiers, respectively. The output terminals of the operational amplifies are connected to first and second switches S1 and S2, respectively.

Operational amplifiers, which are used in a VCOM driver, are circuits, each of which receives a DC input voltage, and outputs a voltage having a stable DC level. The operational amplifiers of the VCOM driver may exhibit great influence on image quality due to a DC level difference between two input voltages and a difference between two output voltages VCOMH and VCOML. When there is an offset voltage between the two voltages, an abnormal phenomenon such as flicker or dimming may be generated. These circuits basically have a buffer structure. However, when a switched capacitor system is used for offset removal, there is a great limitation in buffer design because the output load is great. In this case, the frequency specification must also be high. However, when the operational amplifiers in accordance with embodiments, it is possible to reduce a deviation in image quality while maintaining a stability in accordance with a load at a level equal to a general level.

Hereinafter, a non-inverting amplifier using the operational amplifier in accordance with embodiments will be described with reference to example FIG. 4.

As illustrated in example FIG. 4, the non-inverting amplifier includes one operational amplifier and two resistors Ra and Rb. The operational amplifier has the same configuration as the above-described operational amplifier in accordance with embodiments. The non-inverting input terminal (+) of the operational amplifier is connected to input terminal Vin. The inverting input terminal (−) of the operational amplifier is connected to a node between first and second resistors Ra and Rb connected in series. Output terminal Vout is connected to one end of second resistor Rb.

A non-inverting amplifier is configured to amplify an input voltage to a set accumulation level, and to output the amplified voltage. This non-inverting amplifier may have a problem in that the level of the output voltage may be greatly different from the target level due to an offset of the operational amplifier used in the non-inverting amplifier. Since the offset is a DC offset, the level of the offset voltage is also amplified due to the set accumulation. When the operational amplifier in accordance with embodiments is used, it is possible to realize an accurate non-inverting amplifier capable of reducing an offset without an external adjustment.

As apparent from the above description, the operational amplifier in accordance with embodiments realizes a circuit in which an offset is generated within an expectable range. Since no switching operation is carried out, it is possible to suppress power consumption and noise generation. In addition, it is possible to reduce test time and chip size because no additional external trimming is required.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   an offset modifier including a differential amplification circuit; and
   an offset memory configured to store an offset voltage using a latch circuit,
   wherein the differential amplification circuit includes:
      first and second NMOS transistors connected to an input terminal,
      first and second PMOS transistors respectively connected to drains of the first and second NMOS transistors,
      a third NMOS transistor connected to sources of the first and second NMOS transistors,
      a third PMOS transistor connected to a drain of the second PMOS transistor and a source of the second PMOS transistor,
      a fourth NMOS transistor connected to the third PMOS transistor to form an output to be applied to the offset memory, and
      left and right modification blocks each connected to an associated one of the first and second NMOS transistor in parallel.

2. The apparatus of claim 1, wherein the left modification block comprises a plurality of NMOS transistors connected in parallel.

3. The apparatus of claim 2, wherein the left modification block comprises a plurality of switches connected in parallel.

4. The apparatus of claim 3, wherein each of the plural NMOS transistors is connected in series with an associated one of the plurality of switches.

5. The apparatus of claim 1, wherein the right modification block comprises a plurality of NMOS transistors connected in parallel.

6. The apparatus of claim 5, wherein the right modification block comprises a plurality of switches connected in parallel.

7. The apparatus of claim 6, wherein each of the plural NMOS transistors is connected in series with an associated one of the switches.

8. The apparatus of claim 1, wherein the first NMOS transistor is connected to gates of the plural NMOS transistors of the left modification block at a gate of the first NMOS transistor.

9. The apparatus of claim 8, wherein the source of the first NMOS transistor is connected to a drain of the third NMOS transistor.

10. The apparatus of claim 9, wherein the drain of the first NMOS transistor is connected to a gate of the first PMOS transistor and to a drain of the first PMOS transistor.

11. The apparatus of claim 10, wherein the second NMOS transistor is connected to gates of the plural NMOS transistors of the right modification block at a gate of the second NMOS transistor.

12. The apparatus of claim 11, wherein the source of the second NMOS transistor is connected to the drain of the third NMOS transistor.

13. The apparatus of claim 12, wherein the drain of the second NMOS transistor is connected to the drain of the second PMOS transistor.

14. The apparatus of claim 1, wherein a source of the first PMOS transistor is connected to a source of the second PMOS transistor and a source of the third PMOS transistor.

15. The apparatus of claim 14, wherein the gate of the second PMOS transistor is connected to the gate of the first PMOS transistor.

16. The apparatus of claim 15, wherein the drain of the second PMOS transistor is connected to the drain of the second NMOS transistor.

17. The apparatus of claim 1, wherein a bias voltage is supplied to a gate of the third NMOS transistor so that the third NMOS transistor functions as a current source.

18. An apparatus comprising:
a VCOM driver including a plurality of operational amplifiers comprising an offset modifier including a differential amplification circuit and an offset memory configured to store an offset voltage using a latch circuit, the differential amplification circuit including:
  first and second NMOS transistors connected to an input terminal,
  first and second PMOS transistors respectively connected to drains of the first and second NMOS transistors,
  a third NMOS transistor connected to sources of the first and second NMOS transistors,
  a third PMOS transistor connected to a drain of the second PMOS transistor and a source of the second PMOS transistor,
  a fourth NMOS transistor connected to the third PMOS transistor to form an output to be applied to the offset memory, and
  left and right modification blocks each connected to an associated one of the first and second NMOS transistor in parallel,
wherein the operational amplifiers are connected while having inverting input terminals respectively connected to input terminals, and non-inverting input terminals respectively connected to an output terminal via first and second switches.

19. An apparatus comprising:
non-inverting amplifier including an operational amplifier including an offset modifier having a differential amplification circuit and an offset memory configured to store an offset voltage using a latch circuit, the differential amplification circuit including:
  first and second NMOS transistors connected to an input terminal,
  first and second PMOS transistors respectively connected to drains of the first and second NMOS transistors,
  a third NMOS transistor connected to sources of the first and second NMOS transistors,
  a third PMOS transistor connected to a source of the second PMOS transistor,
  a fourth NMOS transistor connected to the third PMOS transistor to form an output to be applied to the offset memory, and
  left and right modification blocks each connected to an associated one of the first and second NMOS transistor in parallel,
wherein the operational amplifier having an inverting input terminal connected to an input terminal, a non-inverting input terminal connected to a node between first and second resistors connected in series, and an output terminal connected to one end of the second resistor.

* * * * *